United States Patent
Pianka et al.

[11] Patent Number: 6,118,770
[45] Date of Patent: Sep. 12, 2000

[54] VOICE-CHANNEL FREQUENCY SYNCHRONIZATION

[75] Inventors: Boaz Pianka, Kochav Yair; Biniamin Shatit, Or Yehuda, both of Israel

[73] Assignee: D.S.P.C. Technologies Ltd., Giv'at Shmuel, Israel

[21] Appl. No.: 09/083,865

[22] Filed: May 21, 1998

[30] Foreign Application Priority Data

Jun. 4, 1997 [IL] Israel ........................... 120996

[51] Int. Cl.[7] .................................. H04J 3/06
[52] U.S. Cl. .................. 370/324; 370/350; 370/503; 375/355
[58] Field of Search ................. 370/503, 350, 370/324, 516, 518; 375/294, 327, 356, 376, 362, 371, 354, 355, 344; 455/502

[56] References Cited

U.S. PATENT DOCUMENTS

| | | | |
|---|---|---|---|
| 4,788,697 | 11/1988 | Bell et al. ........................ | 375/113 |
| 4,803,726 | 2/1989 | Levine et al. .................... | 380/48 |
| 5,193,103 | 3/1993 | Singh et al. ..................... | 375/120 |
| 5,245,667 | 9/1993 | Lew ................................ | 381/94 |
| 5,497,126 | 3/1996 | Koslec et al. ................... | 331/1 |
| 5,748,842 | 5/1998 | Holmes et al. .................. | 395/2.79 |
| 5,995,844 | 11/1999 | Fukuda ........................... | 455/462 |
| 6,016,331 | 1/2000 | Archaubaud et al. ........... | 375/371 |

*Primary Examiner*—Douglas W. Olms
*Assistant Examiner*—Ken Vanderpuye
*Attorney, Agent, or Firm*—Skjerven, Morrill, MacPherson, Franklin & Friel LLP

[57] ABSTRACT

A synchronized frequency generating system is provided which includes a main crystal clock, for producing a basic frequency $F_B$, a channel sampling phase locked loop (PLL) unit, connected to the main crystal clock, for converting the basic frequency $F_B$ into a channel sampling frequency $F_{CS}$, a voice sampling PLL unit, connected to the main crystal clock, for converting the basic frequency $F_B$ into a voice sampling frequency $F_{VS}$, a time tracking unit, connected to the channel sampling PLL unit, for detecting signal characteristics so as to determine a channel sampling frequency phase change value $\Delta\phi_{CS}$ and a frame timing phase change value $\Delta\phi_{FRAME}$, and a frequency controller, connected to the voice sampling PLL. The frequency controller receives channel sampling frequency phase adjustment data and determines a voice sampling frequency phase change value $\Delta\phi_{VS}$. The frequency controller provides the voice sampling frequency phase change value $\Delta\phi_{VS}$ to the voice sampling PLL.

6 Claims, 6 Drawing Sheets

VOICE-CHANNEL FREQUENCY SYNCHRONIZATION

FIELD OF THE INVENTION

The present invention relates to a method and a system for synchronizing related functions in a communication system apparatus and to a method and a system for synchronizing between a transceiver and a voice encoder-decoder unit in frame based communication in particular.

BACKGROUND OF THE INVENTION

In conventional communication methods, such as TDMA and CDMA, the link between a mobile unit and a base unit, is frame based. The base conventionally includes a very precise and relatively expensive crystal clock which is used to time its operations and synchronize every unit therein. A mobile unit which communicates with this base often includes a low quality crystal clock which is of lower precision than the crystal clock of the base unit.

Therefore, the mobile unit includes correction mechanisms which are used to synchronize the frequency produced by the mobile unit crystal to the frequency produced by the base unit crystal.

Reference is made now to FIG. 1 which is a schematic illustration of a mobile unit and a base unit known in the art. Base unit 2 includes a data interface 14, an FEC unit 16 connected to the data interface 14, a transmitter 18 connected to the FEC unit 16 and an antenna 20 connected to the transmitter 18.

The base unit 2 also includes clock mechanism which includes a crystal 13 for generating a basic high frequency and a PLL unit 15 connected thereto. PLL unit 15 is further connected to the transmitter 18 and provides it with a frequency which is m/n of the basic frequency. It will be appreciated by those skilled in the art, that the values set for m and n can be any natural number (including the number 1).

Mobile unit 4 includes an antenna 30, a channel sampler 26 connected to antenna 30, a demodulator 25 connected to the channel sampler 26, an time tracking unit 28 connected to demodulator 25, a voice decoder 24 connected to the demodulator 25, a digital to analog converter (DAC) 22 connected to voice encoder 24 and a speaker 32 connected to DAC 22.

Mobile unit 4 also includes a timing mechanism which includes a crystal oscillator 23 and 2 PLL units 21 and 25. PLL unit 25 is further connected to channel sampler 26 and provides it with a frequency which is m/n of the basic frequency provided by crystal oscillator 23. PLL unit 21 is further connected to the DAC 22 and provides it with a frequency which is l/k of the basic frequency provided by crystal oscillator 23.

The mobile unit 4 also includes a sampling and transmitting section, including a microphone 42, a voice sampler 34 connected to the microphone 42, a voice encoder 36 connected to the voice sampler 34, a modulator 38 connected to the voice encoder 36 and transmitter DAC 40 connected to the modulator 38.

The timing mechanism of the mobile unit is also connected to the transmitting section so that PLL 21 also times and controls voice sampler 34 and PLL 25 also times and controls the transmitter DAC 40.

Accordingly, transmitter DAC 40 is affected by PLL unit 25 and sampler 34 has to adjust accordingly. The sampler 34 has to provide a block of a predetermined number of samples $N_{BLOCK}$, for each frame produced by modulator 38. Since the timing of transmitter DAC 40 is dynamic, wherein its frequency may increase or decrease, the voice sampler 34 may provide more or less than $N_{BLOCK}$ samples in a block, for each frame.

According to frame based communication standards such as TDMA and CDMA, each frame includes a predetermined number of information bits which may be the information data, voice data and the like. According to TDMA standard, each frame lasts 20 ms. A voice information frame includes 160 voice samples.

Accordingly, the data interface 14 provides blocks to the FEC unit, which include $N_{BLOCK}$ samples, in each block, every 20 ms. The FEC unit 16 produces a frame which is then provided to transmitter 18. The transmitter 18 transmits this frame via antenna 20.

At the mobile unit 4, the channel sampler 26 detects the transmitted frame via antenna 30 and provides it to demodulator 25. The demodulator 25 analyzes the frame, extracts voice coded data and provides it to voice decoder 24. The voice decoder 24 decodes this data and provides the decoded signal to DAC unit 22. The DAC unit 22 converts the decoded signal into analog signal and provides it to speaker 32 which in turn produces sounds.

In the mobile unit 4, the channel sampler 26 and the DAC 22 have to be synchronized too. Thus, for every frame detected by channel sampler 26, the DAC 22 has to convert $N_{BLOCK}$ samples. It will be appreciated that the synchronization mechanisms, of both base unit 2 and mobile unit 4, have to be completely synchronized. Accordingly, the channel sampler 26 has to be synchronized with FEC 16 so that each frame produced by FEC 16 will be received as such in channel sampler 26.

Conventional communication systems include a calibration mechanism which constantly calibrates PLL 25 so as to synchronize it according to the transmitting rate of the base unit 2. It will be appreciated that since DAC 22 is dependent on channel sampler 26 changing the frequency on which channel sampler 26 operates will affect DAC 22. For example, if the frequency of channel sampler 26 increases, then the DAC 22 may be provided with more than $N_{BLOCK}$ samples in 20 ms.

On the other hand, if the frequency of channel sampler 26 is decreased then the DAC 22 might be provided with less than $N_{BLOCK}$ samples per frame. Both of these situations are not allowed in TDMA and for that matter in most frame base communication standards.

Another method known in the art deletes or estimates the last samples. If the current number of samples which are to be provided for a block exceeds $N_{BLOCK}$ samples than $N_{BLOCK}$ samples are selected and provided as a block and the rest of the samples are deleted. If, on the other hand, there are less than $N_{BLOCK}$ samples and time comes to provide them to the voice encoder then samples are estimated according to the existing samples so as to provide complementary samples which will complete the block to $N_{BLOCK}$ samples. It will be appreciated that according to this method, the quality of speech is reduced since an additional element of distortion or noise is introduced, which did not exist in the original sampled or the decoded signal.

SUMMARY OF THE PRESENT INVENTION

It is an object of the present invention to provide a novel method and a novel system for providing synchronized sampling frequencies, which overcomes the disadvantages of the prior art.

In accordance with the present invention there is thus provided a synchronized frequency generating system which includes a main crystal clock, for producing a basic frequency $F_B$, a channel sampling phase locked loop (PLL) unit, connected to the main crystal clock, for converting the basic frequency $F_B$ into a channel sampling frequency $F_{CS}$, a voice sampling PLL unit, connected to the main crystal clock, for converting the basic frequency $F_B$ into a voice sampling frequency $F_{VS}$, a time tracking unit, connected to the channel sampling PLL unit, for detecting signal characteristics so as to determine a channel sampling frequency phase change value $\Delta\phi_{CS}$ and a frame timing phase change value $\Delta\phi_{FRAME}$ and a frequency controller, connected to the voice sampling PLL.

The frequency controller receives channel sampling frequency phase adjustment data and determines a voice sampling frequency phase change value $\Delta\phi_{VS}$. The frequency controller provides the voice sampling frequency phase change value $\Delta\phi_{VS}$ to the voice sampling PLL.

Then, the frequency controller receives channel sampling frequency phase adjustment data from the time tracking unit and the frequency controller receives channel sampling frequency phase adjustment data from the channel sampling PLL.

The system according to the invention may further include a primary voice sampling PLL connected between the voice sampling PLL and the main crystal clock. The primary voice sampling PLL converts the basic frequency $F_B$ into primary channel sampling frequency $F_{CS1}$ and the voice sampling PLL converts the primary channel sampling frequency $F_{CS1}$ into a channel sampling frequency $F_{CS}$.

According to one aspect of the invention, the primary voice sampling PLL converts the basic frequency $F_B$ into primary channel sampling frequency $F_{CS1}$, by changing the voice sampling phase.

According to another aspect of the invention, the voice sampling PLL converts the primary channel sampling frequency $F_{CS1}$ into a channel sampling frequency $F_{CS}$, by changing the voice sampling phase.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The present invention overcomes the disadvantages of the prior art by controlling the frequency of the voice sampling mechanism.

Figure 1:
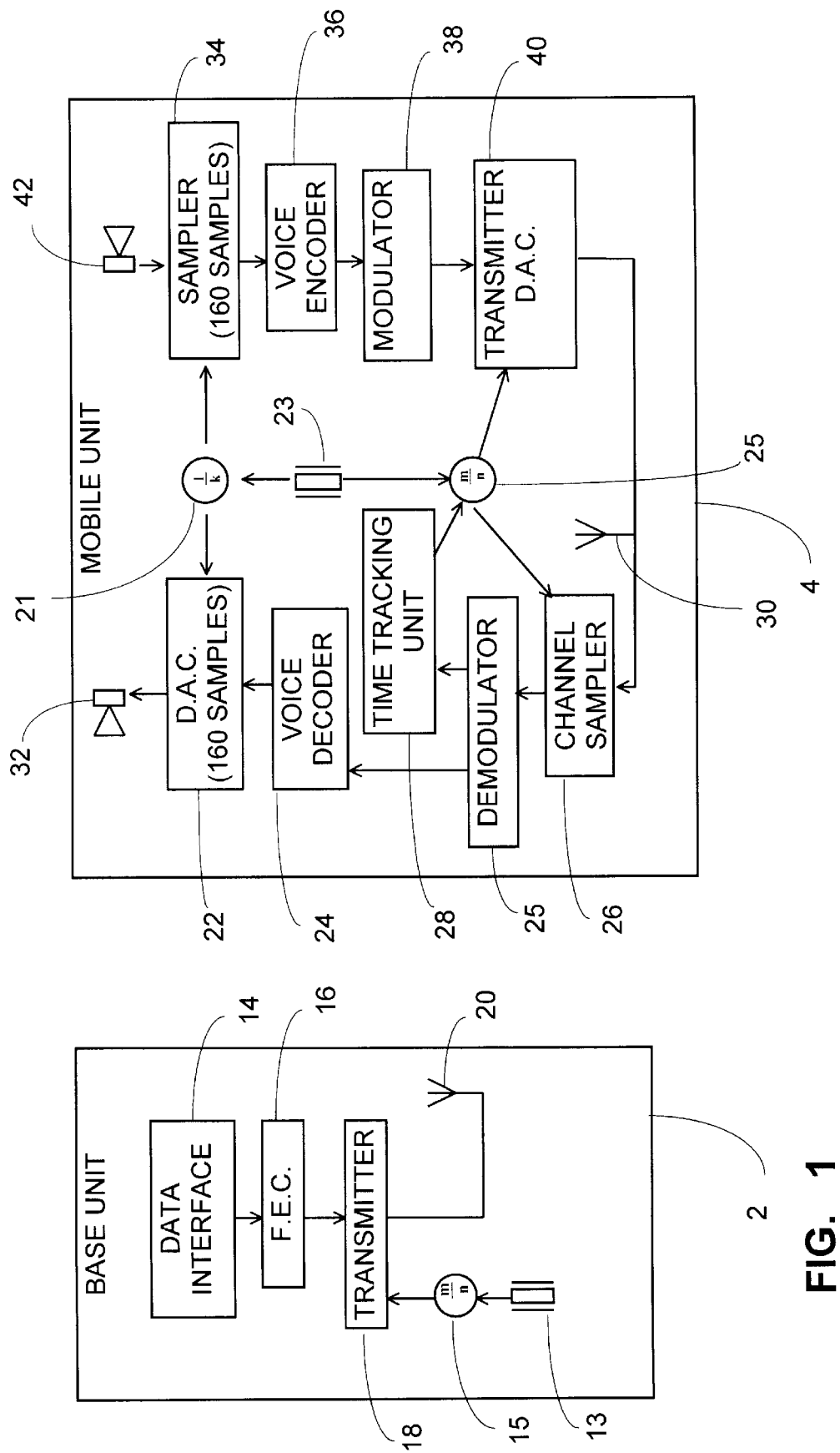
FIG. 1 is a schematic illustration of a prior art system, for controlling the internal frequency of a transceiver.
Figure 2:
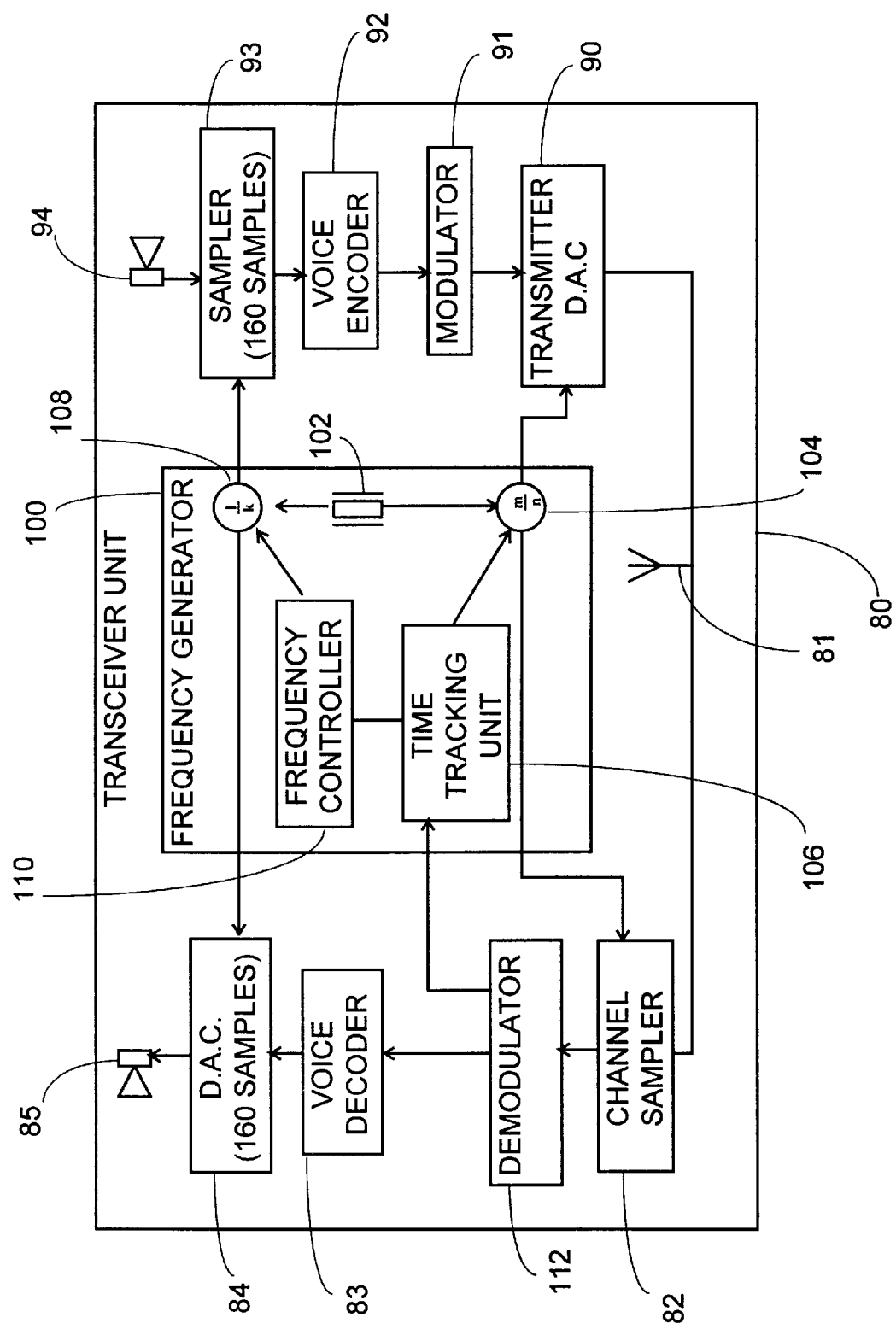
FIG. 2 is a schematic illustration of a transceiver which includes a synchronized frequency generating system, constructed and operative in accordance with a preferred embodiment of the present invention.

Reference is now made to FIG. 2 which is a schematic illustration of a transceiver, generally referenced 80, which includes a synchronized frequency generating system, generally referenced 100, constructed and operative in accordance with a preferred embodiment of the present invention.

Transceiver 80 includes an antenna 81, a channel sampler 82 connected to the antenna 81, a demodulator 112 connected to the channel sampler 82, a voice decoder 83 connected to the demodulator 112, a DAC unit 84 connected to the voice decoder 83 and a speaker 85 connected to the DAC unit 84. The transceiver 80 also includes a transmitter DAC 90 connected to the antenna 81, a modulator 91 connected to the transmitter DAC 90, a voice encoder 92 connected to the modulator 91, a voice sampler 93 connected to the voice encoder 92 and a microphone 94 connected to the voice sampler 93. The transceiver unit 80 further includes synchronized frequency generating system 100.

System 100 includes a main crystal clock 102, a channel sampling PLL 104 connected to the main crystal clock 102, a time tracking unit 106 connected to the channel sampling PLL 104, a voice sampling PLL 108 connected to the main crystal clock 102 and a frequency controller 110 connected to voice sampling PLL 108 nd time tracking unit 106.

The time tracking unit 106 is also connected to the demodulator 112. The channel sampling PLL 104 is also connected to the channel sampler 82 and the transmitter DAC 90. The voice sampling PLL 108 is also connected to voice sampler 93 and to the DAC 84.

The main crystal clock 102 produces a basic frequency $F_B$ and provides it to PLL's 104 and 108. PLL 104 reduces this frequency by a ratio of m/n, thereby producing a channel sampling frequency $F_{CS}$. PLL 108 reduces this frequency by a ratio of l/k, thereby producing a voice sampling frequency $F_V$.

Basically, the demodulator 112 acquires an initial symbol phase value as well as frame timing. Then, the demodulator 112 initializes the PLL 104 so that the channel sampling phase is aligned with the channel symbols at the antenna 81 and the framing phase is aligned with the boundary between information frames at the antenna 81.

Figure 6:
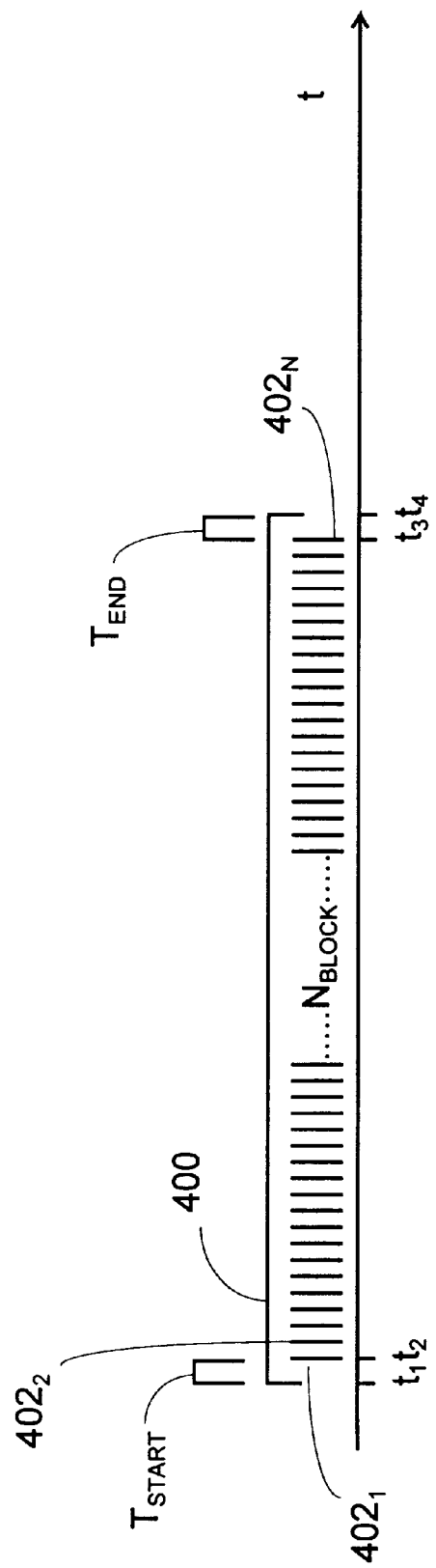
FIG. 6 which is a schematic illustration of the transmitting and voice sampling timing diagram.

Reference is also made to FIG. 6 which is a schematic illustration of the transmitting and voice sampling timing diagram. Frame 400 defines a time period which commences at $t_1$ and ends at $t_4$. $N_{BLOCK}$ voice samples, generally designated 402, have to be sampled during time from $t_1$ to $t_4$, starting at voice samples $402_1$, which is sampled at $t_2$ and ending at voice sample $402_N$, which is sampled at $t_3$.

It will be appreciated that the first voice sample $402_1$ has to be sampled after the frame has commenced, wherein $T_{START}=t_2-t_1>0$. Similarly, the last voice sample $402_N$ has to be sampled before the frame has ended, wherein $T_{END}=t_4-t_3>0$.

According to the present invention, $T_{START}$ is greater than a predetermined value $T_{ERROR}$ which is higher than a characteristic frequency error, so that even if there occurred a frequency shift, then the first voice sample will be sampled after $t_1$. In a similar manner, $T_{END}$ is also greater than the predetermined value $T_{ERROR}$.

According to the present invention, the frequency controller 110 calculates $T_{START}$ and initializes the PLL 108 to control the voice sampler 93 and the DAC, so that the first voice sample $402_1$ is sampled after $T_{START}$ has passed since the frame was first detected. The initialization also determines sample $402_N$ will be sampled $T_{END}$ before the sampling of frame 400 is expected to end.

The time tracking unit 106 detects the channel at the demodulator 112 and determines if the channel sampling frequency $F_{CS}$ has to be adjusted so as to synchronize to the received RF signal.

When the time tracking unit 106 detects that the channel sampling frequency $F_{CS}$ has to be changed, it provides a channel sampling frequency phase change command to channel sampling PLL 104 and at the same time it informs frequency controller 110 about the change in phase which is about to occur. Then, the frequency controller 110 defines a voice sampling frequency change, according to the channel sampling frequency phase change and provides a voice sampling frequency phase change command to the voice sampling PLL 108.

As a result, both PLL's 104 and 108 re-adjust their respective frequency ratios. This way, the frequency provided to the voice sampler is well synchronized to the frequency provided to the channel sampler.

This process of detecting and adjusting is continuous, so that over a considerable period of time, a plurality of frequency phase changes results in an average frequency change.

Figure 3:
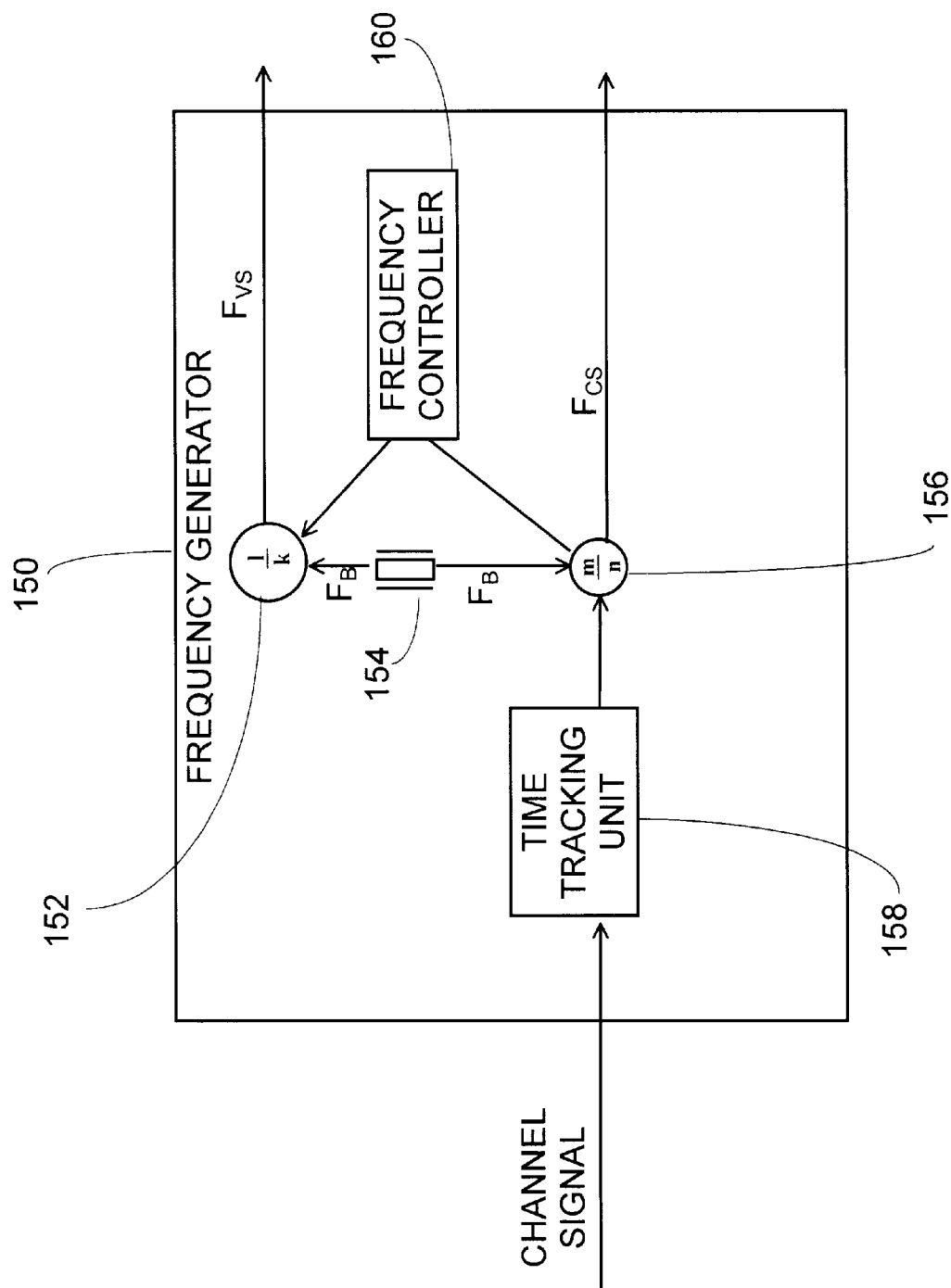
FIG. 3 is a schematic illustration of a synchronized frequency generating system, constructed and operative in accordance with another preferred embodiment of the present invention.

Reference is made now to FIG. 3 which is a schematic illustration of a synchronized frequency generating system, generally referenced 150, constructed and operative in accordance with another preferred embodiment of the present invention.

Synchronized frequency generating system 150 includes a time tracking unit 158, a channel sampling PLL 156 connected to the time tracking unit 158, a main crystal clock 154 connected to the channel sampling PLL 156, a voice sampling PLL 152 connected to the main crystal clock 154 and a frequency controller 160 connected to the channel sampling PLL 156 and the voice sampling PLL 152.

The main crystal clock 154 produces a base frequency $F_B$ which is generally a very high frequency form and provides it to channel sampling PLL 156 and voice sampling PLL 152. Channel sampling PLL 156 reduces the basic frequency $F_B$ according to a ratio m/n so as to produce a channel sampling frequency $F_{CS}$. Voice sampling PLL 152 reduces the basic frequency $F_B$ according to a ratio 1/k so as to produce a voice sampling frequency $F_{VS}$. Time tracking unit 158 detects the channel signal and determines from the duration of a received frame and its respective symbols, if the channel sampling frequency $F_{CS}$ has to be adjusted. If so, then the time tracking unit 158 provides a ratio change command to PLL 156 to change the ratio m/n so as to produce a new channel sampling frequency $F_{CS}$ which will be identical to the frequency of the channel signal.

The frequency controller 160 detects when the ratio m/n, of the channel sampling PLL 156 has changed and provides a ratio change command to the voice sampling PLL, so as to adjust ratio 1/k, accordingly. As a result, the voice sampling PLL 152 reduces the basic frequency $F_B$ to a voice sampling frequency $F_{VS}$, maintaining the correct reduction ratio 1/k, which is fully synchronized with the reduction ratio m/n, of the channel sampling PLL 156, so that the channel sampling frequency $F_{CS}$ and the voice sampling frequency $F_{VS}$ are fully synchronized at all times.

It will be noted that each ratio change command may be comprised of a plurality of phase changes.

Figure 4:
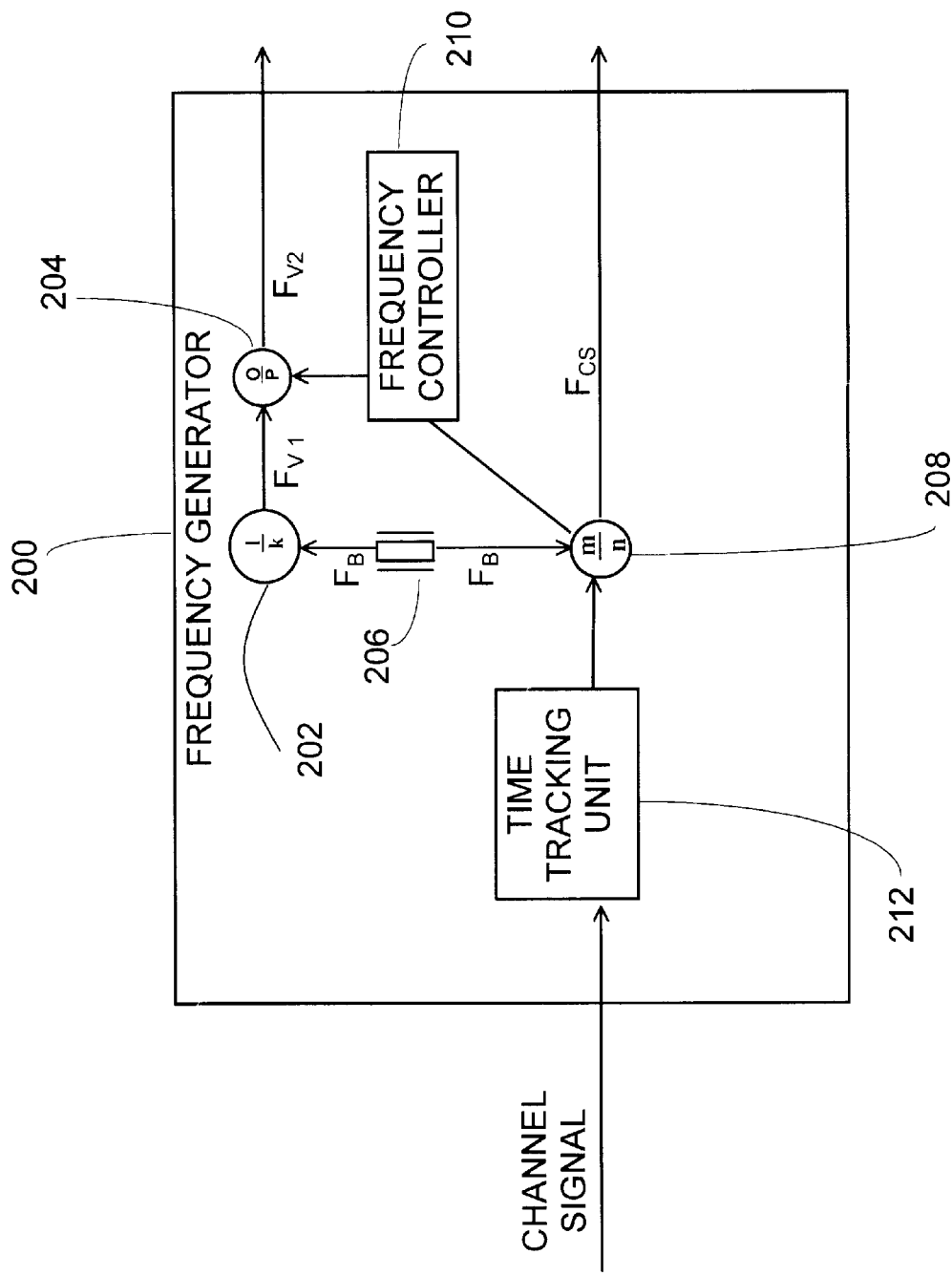
FIG. 4 is a schematic illustration of a synchronized frequency generating system, constructed and operative in accordance with a further embodiment of the present invention.

Reference is made now to FIG. 4 which is a schematic illustration of a synchronized frequency generating system, generally referenced 200, constructed and operative in accordance with a further embodiment of the present invention.

System 200 includes a time tracking unit 212, a channel sampling PLL 208 connected to the time tracking unit 212, a main crystal clock 206 connected to the channel sampling PLL 208, a primary voice sampling PLL 202 connected to the main crystal clock 206, a secondary voice sampling PLL 204 connected to the primary voice sampling PLL 202 and a frequency controller 210 connected to the channel sampling PLL 208 and to the secondary voice sampling PLL 204.

The main crystal clock 206 produces a high frequency and provides it to the channel sampling PLL 208 and to the primary voice sampling PLL 202. The channel sampling PLL 208 reduces this frequency according to a ratio m/n so as to produce a channel frequency $F_{CS}$. The primary voice sampling PLL 202 reduces the main frequency according to a ratio 1/k so as to produce a primary voice sampling frequency $F_{V1}$ and provides it to the secondary PLL 204. Secondary voice sampling PLL 204 further reduces the frequency $F_{VS1}$ according to a ratio o/p so as to produce a secondary voice sampling frequency $F_{VS2}$ which then may be provided to a voice sampling unit. The secondary voice sampling PLL 204 is controlled by the frequency controller 210 which may provide it with ratio change commands so as to change the ratio o/p. Such ratio changes enable the system to adjust the voice sampling frequency $F_{VS2}$.

Time tracking unit 212 detects a channel signal and determines whether the channel sampling frequency $F_{CS}$ is to be adjusted according to the received channel signal. When the time tracking unit 212 determines that $F_{CS}$ should be adjusted it produces a frequency change command and provides it to channel sampling PLL 208.

It will be noted that the channel frequency adjustments and the voice frequency adjustments may be provided through a plurality of phase changes.

Figure 5:
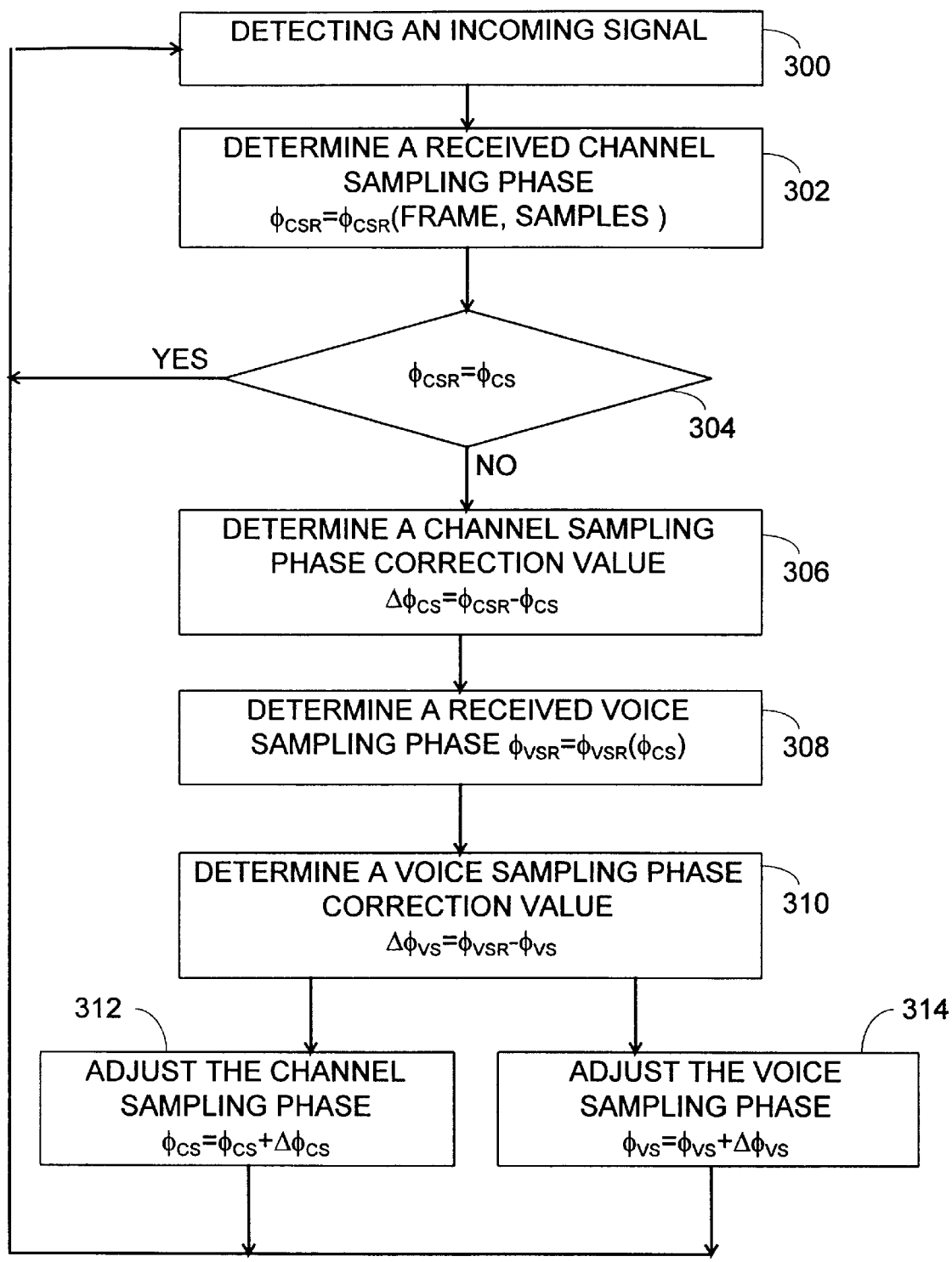
FIG. 5 is a flow chart illustration of a method for synchronizing channel sampling frequency and voice sampling frequency, operative in accordance with yet another embodiment of the present invention.

Reference is now made to FIG. 5 which is a flow chart illustration of a method for operating system 200, operative in accordance with yet a further embodiment of the present invention.

In step 300, the system 200 receives the incoming signal, thereby detecting the phase and the framing information of the signal. Then, the system 200 analyzes the incoming signal so as to determine a received channel sampling phase $\phi_{CSR}$ (step 302), according to various characteristics of the received signal such as frame phase $\phi_{FRAME}$, symbol phase $\phi_{SYMBOL}$ and the like.

In step 304, the system checks if the received channel sampling frequency phase $\phi_{CSR}$ is equal to the current setting of the channel sampling frequency phase $\phi_{CS}$, in the system. If $\phi_{CSR}$ is equal to $\phi_{CS}$ then the system proceeds back to step 300, since the current setting is correct. Otherwise, $\phi_{CS}$ has to be adjusted according to $\phi_{CSR}$ and so the system proceeds to step 306.

In step 306, the system 200 determines a channel sampling frequency phase correction value $\Delta\phi_{CS}$, wherein $\Delta\phi_{CS}=\phi_{CSR}-\phi_{CS}$.

In step 308, the system 200 determines a received voice sampling frequency phase $\phi_{VSR}$, according to the received channel sampling frequency $\phi_{CSR}$.

In step 310, the system 200 utilizes the received voice sampling frequency phase $\phi_{VSR}$ and the current setting of the voice sampling frequency phase of the system $\phi_{VS}$, so as to determine a voice sampling frequency phase correction value $\Delta\phi_{VS}$, wherein $\Delta\phi_{VS}=\phi_{VSR}-\phi_{VS}$. Then, the system proceeds simultaneously, to steps 312 and 314.

In step 312, the system 200 adjusts the channel sampling frequency phase $\phi_{CS}$ according to the channel sampling frequency phase correction value $\Delta\phi_{CS}$ wherein $\phi_{CS}=\phi_{CS}+\Delta\phi_{CS}$.

In step 314, the system 200 adjusts the voice sampling frequency phase $\phi_{VS}$, according to the voice sampling frequency phase correction value $\Delta\phi_{VS}$ wherein $\phi_{VS}=\phi_{VS}+\Delta\phi_{VS}$.

Finally, the system repeats the whole process from step 300.

According to the present invention, no voice sample estimating mechanisms are required, since the channel sampling frequency and the voice frequency are well synchronized at all times. It will be noted however that the frequency controller can be connected at any point at the receiving section of the transceiver unit wherein the channel frequency can be detected.

It will be appreciated by persons skilled in the art that the present invention is not limited to what has been particularly shown and described hereinabove. Rather the scope of the present invention is defined only by the claims which follow.

We claim:

1. A synchronized frequency generating system comprising:
   a. a main crystal clock, for producing a basic frequency $F_B$;
   b. a channel sampling phase locked loop (PLL) unit, connected to said main crystal clock, for converting said basic frequency $F_B$ into a channel sampling frequency $F_{CS}$;
   c. a voice sampling PLL unit, connected to said main crystal clock, for converting said basic frequency $F_B$ into a voice sampling frequency $F_{VS}$;
   d. a time tracking unit, connected to said channel sampling PLL unit, for detecting signal characteristics so as to determine a channel sampling frequency phase change value $\Delta\phi_{CS}$ and a frame timing frequency change value $\Delta\phi_{FRAME}$; and
   e. a frequency controller, connected to said voice sampling PLL,
      wherein said frequency controller receives channel sampling frequency phase adjustment data, thereby determining a voice sampling frequency frequency change value $\Delta\phi_{VS}$, and
      wherein said frequency controller provides said voice sampling frequency phase change value $\Delta\phi_{VS}$ to said voice sampling PLL.

2. The system according to claim 1 wherein said frequency controller receives channel sampling frequency phase adjustment data from said time tracking unit.

3. The system according to claim 1 wherein said frequency controller receives channel sampling frequency phase adjustment data from said channel sampling PLL.

4. The system according to claim 1 further comprising a primary voice sampling PLL connected between said voice sampling PLL and said main crystal clock,
   wherein said primary voice sampling PLL converts said basic frequency $F_B$ into primary channel sampling frequency $F_{CS1}$ and said voice sampling PLL converts said primary channel sampling frequency $F_{CS1}$ into a channel sampling frequency $F_{CS}$.

5. The system according to claim 4 wherein said primary voice sampling PLL converts said basic frequency $F_B$ into primary channel sampling frequency $F_{CS1}$, by changing the voice sampling phase.

6. The system according to claim 4 wherein said voice sampling PLL converts said primary channel sampling frequency $F_{CS1}$ into a channel sampling frequency $F_{CS}$, by changing the voice sampling phase.

* * * * *